United States Patent
Mao et al.

(10) Patent No.: US 11,118,259 B2
(45) Date of Patent: Sep. 14, 2021

(54) EVAPORATION DEVICE AND EVAPORATION METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Bo Mao, Beijing (CN); Changjun Jiang, Beijing (CN); Jun Li, Beijing (CN); Langlang Ha, Beijing (CN); Yikun Dou, Beijing (CN); Yang Xu, Beijing (CN); Mengyu Luan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/331,749

(22) PCT Filed: Jul. 4, 2018

(86) PCT No.: PCT/CN2018/094458
§ 371 (c)(1),
(2) Date: Mar. 8, 2019

(87) PCT Pub. No.: WO2019/037546
PCT Pub. Date: Feb. 28, 2019

(65) Prior Publication Data
US 2019/0203339 A1    Jul. 4, 2019

(30) Foreign Application Priority Data
Aug. 24, 2017    (CN) .......................... 201710741658.1

(51) Int. Cl.
*C23C 14/00* (2006.01)
*C23C 14/04* (2006.01)
(Continued)

(52) U.S. Cl.
CPC .......... *C23C 14/042* (2013.01); *C23C 14/048* (2013.01); *C23C 14/24* (2013.01);
(Continued)

(58) Field of Classification Search
CPC .................................................. C23C 14/042
See application file for complete search history.

(56) References Cited

U.S. PATENT DOCUMENTS

2001/0026125 A1* 10/2001 Yamazaki ............... H01L 51/56
 313/505
2005/0103442 A1    5/2005 Chen et al.
(Continued)

FOREIGN PATENT DOCUMENTS

CN    1478291 A    2/2004
CN    1684774 A    10/2005
(Continued)

OTHER PUBLICATIONS

Berengueres et al. "Gecko Inspired Electrostatic Chuck" (2006).*
(Continued)

*Primary Examiner* — Austin Murata
(74) *Attorney, Agent, or Firm* — Brooks Kushman P.C.

(57) ABSTRACT

The present disclosure provides an evaporation device and an evaporation method. The evaporation device includes: an evaporation chamber; a plurality of spaced conductive baffles disposed in the evaporation chamber and dividing the evaporation chamber into a plurality of evaporation sub-chambers, the conductive baffles configured to carry charges of a first polarity; an evaporation source disposed in at least one of the evaporation sub-chambers; and a particle charg-
(Continued)

ing circuit disposed in at least one of the evaporation sub-chambers. The particle charging circuit is configured to control evaporation material particles generated from the evaporation source in at least one of the evaporation sub-chambers to have charges of the first polarity.

15 Claims, 2 Drawing Sheets

(51) Int. Cl.
  *C23C 14/32*  (2006.01)
  *C23C 14/54*  (2006.01)
  *H01L 51/50*  (2006.01)
  *H01L 51/52*  (2006.01)
  *H01L 51/56*  (2006.01)
  *C23C 14/24*  (2006.01)
  *H01L 51/00*  (2006.01)

(52) U.S. Cl.
  CPC .......... *C23C 14/325* (2013.01); *C23C 14/543* (2013.01); *C23C 14/548* (2013.01); *H01L 51/5012* (2013.01); *H01L 51/52* (2013.01); *H01L 51/5253* (2013.01); *H01L 51/56* (2013.01); *H01L 51/001* (2013.01)

(56) References Cited

U.S. PATENT DOCUMENTS

| | | | |
|---|---|---|---|
| 2006/0068082 A1 | 3/2006 | Marra et al. | |
| 2012/0040233 A1* | 2/2012 | Kim | H01M 2/1646 |
| | | | 429/152 |
| 2013/0313535 A1* | 11/2013 | Heo | H01L 51/5064 |
| | | | 257/40 |
| 2016/0019837 A1 | 1/2016 | Liu et al. | |
| 2016/0056378 A1 | 2/2016 | Zhang | |
| 2017/0162832 A1* | 6/2017 | Hahn | C23C 14/042 |
| 2017/0211172 A1 | 7/2017 | Pei et al. | |

FOREIGN PATENT DOCUMENTS

| | | |
|---|---|---|
| CN | 101016620 A | 8/2007 |
| CN | 102369306 A | 3/2012 |
| CN | 203270020 U | 11/2013 |
| CN | 103700780 | 4/2014 |
| CN | 104136653 A | 11/2014 |
| CN | 104157672 A | 11/2014 |
| CN | 104241551 A | 12/2014 |
| CN | 104726827 A | 6/2015 |
| CN | 106148893 A | 11/2016 |
| CN | 106816553 A | 6/2017 |
| JP | 2004103341 A | 4/2004 |
| JP | 2010116591 A | 5/2010 |
| KR | 101530318 B1 | 6/2015 |
| WO | 2007034944 A1 | 3/2007 |

OTHER PUBLICATIONS

First Office Action for Chinese Application No. 201710741658.1, dated Dec. 10, 2019, 9 Pages.

International Search Report and Written Opinion for Application No. PCT/CN2018/094458, dated Sep. 19, 2018, 11 Pages.

* cited by examiner controlling the conductive baffle to have charges of a first polarity, where the conductive baffle is disposed between adjacent two evaporation sources and divides the evaporation chamber into several evaporation sub-chambers, and the evaporation sources are disposed in the evaporation sub-chambers in a one-to-one manner

↓ controlling the evaporation source to generate evaporation material particles

↓ controlling the evaporation material particles generated by the evaporation source to have charges of the first polarity, and evaporating the charged evaporation material particles onto the substrate under action of repulsive force between same kind of charges on the conductive baffle and the evaporation material particles, thereby forming a pattern of one film

FIG. 3

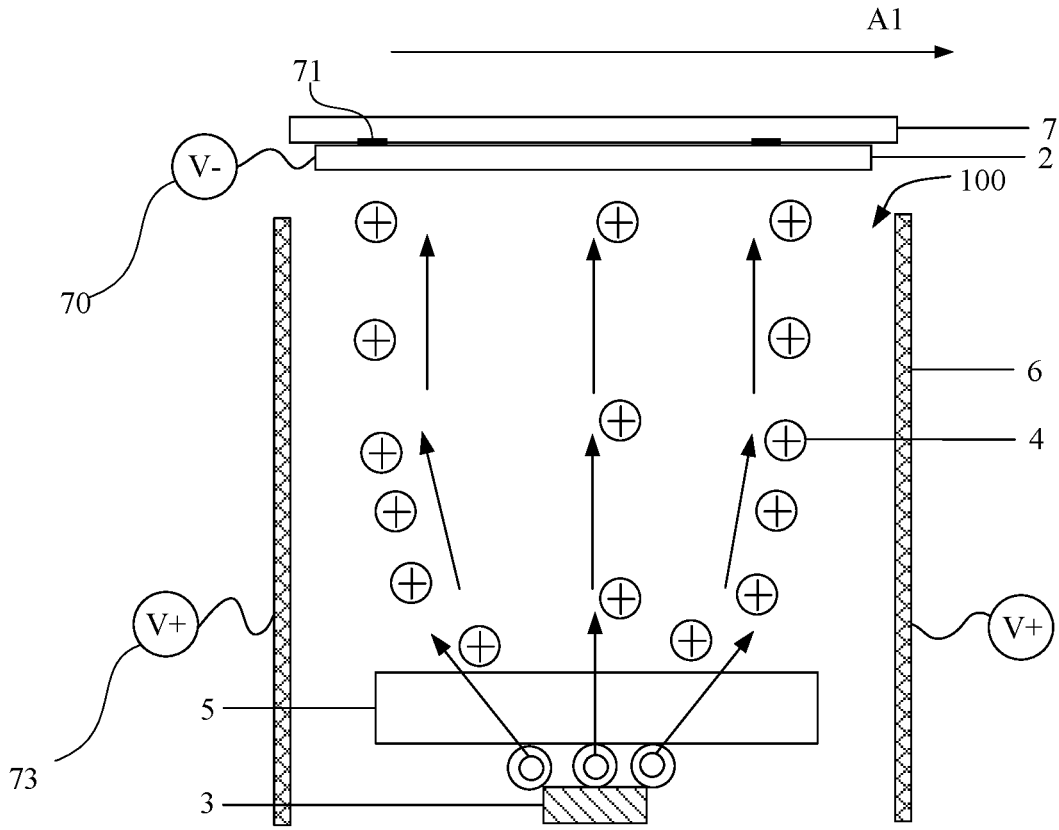

FIG. 4

EVAPORATION DEVICE AND EVAPORATION METHOD

CROSS-REFERENCE TO RELATED APPLICATIONS

This application is the U.S. national phase of PCT Application No. PCT/CN2018/094458 filed on Jul. 4, 2018, which claims priority to Chinese Patent Application No. 201710741658.1 filed on Aug. 24, 2017, which are incorporated herein by reference in their entireties.

TECHNICAL FIELD

The present disclosure relates to the field of manufacturing films, and in particular to an evaporation device and an evaporation method.

BACKGROUND

Display devices are developing in the direction of large-scale, ultra-thin, high resolution, high brightness and low power consumption. Recently, organic light emitting diodes (OLEDs) have become a popular emerging flat panel display products at home and abroad due to their characteristics such as self-luminescence, wide viewing angle, short reaction time, high luminous efficiency, wide gamut, low operating voltage, thin panel, large-size and flexible panel and simple manufacturing process, and the potential of low cost.

A variety of organic light-emitting materials are required for large-scale OLED display devices, and thus a corresponding number of evaporation sources are required. An OLED organic vapor deposition chamber in the related art is a large space-communicated chamber. One disadvantage of such large chamber is that during a long evaporation process, there is a certain probability that molecules of the various evaporation sources may diffuse in space, resulting in crosstalk between the molecules. This results in defects of materials evaporated onto a substrate due to impurity of the materials, which leads to dark spots and affects the service life of the OLED and deviation of a luminous color coordinates of the display device.

SUMMARY

One embodiment of the present disclosure provides an evaporation device for evaporating patterns of films on a to-be-evaporated substrate. The evaporation device includes: an evaporation chamber; a plurality of spaced conductive baffles disposed in the evaporation chamber and dividing the evaporation chamber into a plurality of evaporation sub-chambers, where the conductive baffles are configured to carry charges of a first polarity; an evaporation source disposed in at least one of the evaporation sub-chambers; and a particle charging circuit disposed in at least one of the evaporation sub-chambers. The particle charging circuit is configured to control evaporation material particles generated from the evaporation source in at least one of the evaporation sub-chambers to have charges of the first polarity.

In the above evaporation device, the evaporation sources in different evaporation sub-chambers generate different evaporation material particles.

In the above evaporation device, the evaporation device further includes a field generation circuit configured to generate a guiding electric field; and the guiding electric field is configured to drive the charged evaporation material particles to be evaporated onto the substrate.

In the above evaporation device, the field generation circuit includes a substrate charging circuit configured to control the to-be-evaporated substrate to have charges of a second polarity, and the guiding electric field is generated between the conductive baffles and the substrate.

In the above evaporation device, the substrate charging circuit and the charge supply circuit are two electrodes of opposite polarities.

In the above evaporation device, the particle charging circuit is an ion source.

In the above evaporation device, the evaporation device further includes a charge supply circuit configured to control the conductive baffles to have charges of the first polarity.

In the above evaporation device, the evaporation device further includes a transmission device is disposed in the evaporation chamber; the conductive baffles divide the evaporation chamber into several evaporation sub-chambers along the first direction; and the transmission device transfers the to-be-evaporated substrate along the first direction.

In the above evaporation device, the transmission device includes a rail that extends along the first direction; and the to-be-evaporated substrate is slidably mounted on the rail.

In the above evaporation device, there are several evaporation sources arranged at equal intervals.

In the above evaporation device, each evaporation source is configured to generate luminescent material particles capable of emitting light of a specific color.

One embodiment of the present disclosure provides an evaporation method implemented with the above evaporation device, for evaporating patterns of films on a to-be-evaporated substrate, the evaporation method includes: controlling the conductive baffle in one of the evaporation sub-chambers to have charges of a first polarity; controlling the evaporation source in one of the evaporation sub-chambers to generate evaporation material particles; and controlling the evaporation material particles generated by the evaporation source in one of the evaporation sub-chambers to have charges of the first polarity, and evaporating the charged evaporation material particles onto the substrate under action of repulsive force between same kind of charges on the conductive baffle in one of the evaporation sub-chambers and the evaporation material particles, thereby forming a pattern of one film.

In the above evaporation method, the evaporation method further includes: generating a guiding electric field configured to drive the charged evaporation material particles to be evaporated onto the substrate.

In the above evaporation method, the generating a guiding electric field includes: controlling the to-be-evaporated substrate to have charges of a second polarity, thereby forming the guiding electric field between the conductive baffle in one of the evaporation sub-chambers and the substrate.

In the above evaporation method, the evaporation method further includes: transferring the to-be-evaporated substrate along the first direction, thereby enabling the charged evaporation material particles output by the evaporation source in each evaporation sub-chamber to be evaporated onto the substrate.

In the above evaporation method, the substrate is an organic electroluminescent display substrate. The controlling the evaporation source in one of the evaporation sub-chambers to generate evaporation material particles includes: controlling the evaporation source in one of the evaporation sub-chambers to generate luminescent material particles capable of emitting light of a specific color. The controlling the evaporation material particles generated by the evaporation source in one of the evaporation sub-chambers to have charges of the first polarity, and evaporating the charged evaporation material particles onto the substrate under action of repulsive force between same kind of charges on the conductive baffle in one of the evaporation sub-chambers and the evaporation material particles, thereby forming a pattern of one film, includes: controlling the luminescent material particles generated by the evaporation source in one of the evaporation sub-chambers to have charges of the first polarity, and evaporating the charged luminescent material particles onto a corresponding sub-pixel region of the substrate under action of repulsive force between same kind of charges on the conductive baffle in one of the evaporation sub-chambers and the evaporation material particles, thereby forming a light-emitting layer.

BRIEF DESCRIPTION OF THE DRAWINGS

In order to illustrate technical solutions according to embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

FIG. 3 is a flow chart of an evaporation method according to an embodiment of the present disclosure; and FIG. 4 is a schematic view of an evaporation sub-chamber of the evaporation device according to an embodiment of the present disclosure.

DETAILED DESCRIPTION

Embodiments of the present disclosure will be described hereinafter in details in conjunction with the drawings and embodiments. The following embodiments are used to illustrate the present disclosure and not used to limit scope of the present disclosure.

Figure 1:
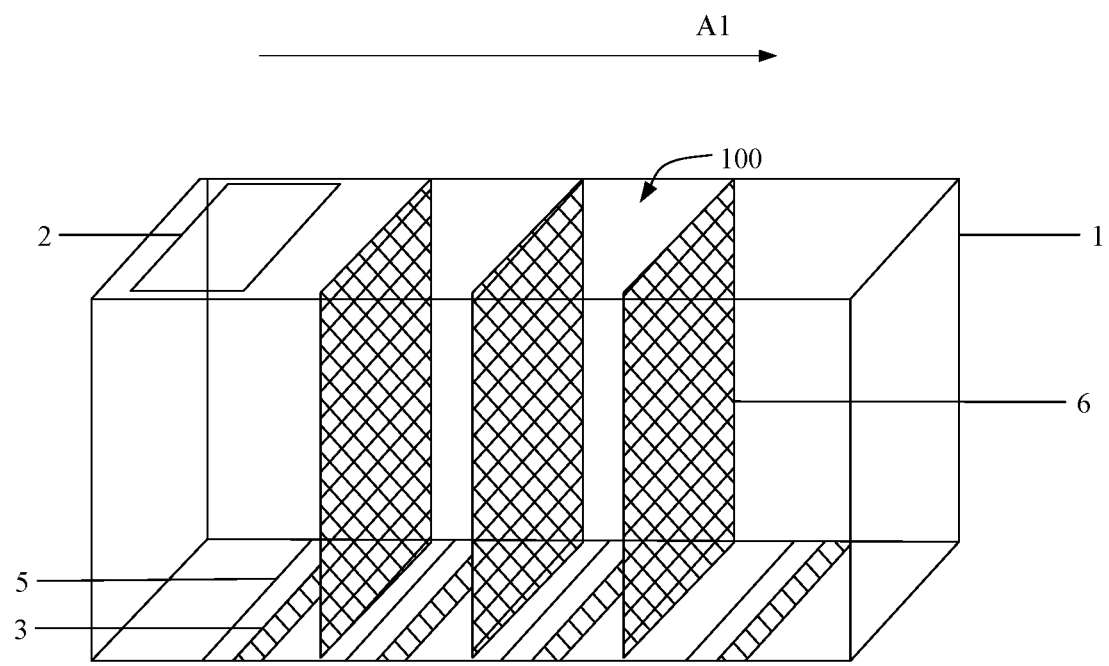
FIG. 1 is a schematic view of an evaporation device according to an embodiment of the present disclosure.
Figure 2:
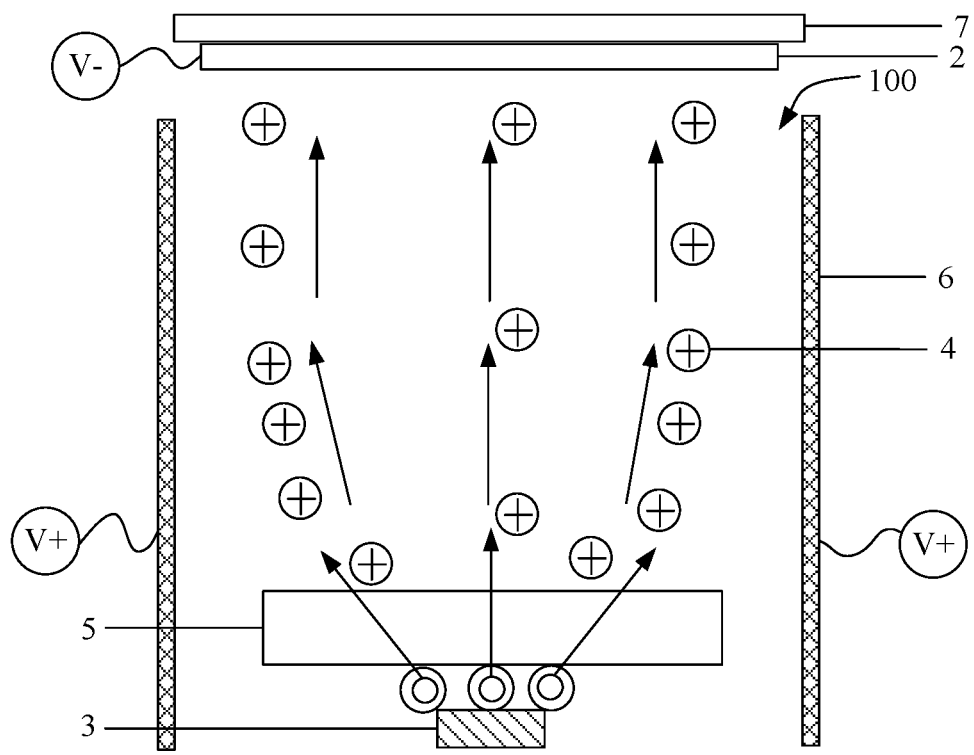
FIG. 2 is a schematic view of an evaporation sub-chamber of the evaporation device according to an embodiment of the present disclosure.

Referring to FIG. 1 and FIG. 2, one embodiment of the present disclosure provides an evaporation device for evaporating patterns of several films on a to-be-evaporated substrate 2. The evaporation device includes:

an evaporation chamber 1;

a plurality of evaporation sources 3 disposed in the evaporation chamber 1; where each evaporation source 3 is used for generating evaporation material particles 4, and different evaporation sources generate different evaporation material particles 4;

a conductive baffle 6 disposed between adjacent two evaporation sources 3; where the conductive baffle 6 divides the evaporation chamber 1 into several evaporation sub-chambers 100, and the evaporation sources 3 are disposed in the evaporation sub-chambers 100 in a one-to-one manner;

a charge supply circuit configured to control the conductive baffle 6 to have charges of a first polarity; and a particle charging circuit 5 disposed in each evaporation sub-chamber 100, where the particle charging circuit 5 is configured to control the evaporation material particles 4 generated from the evaporation source 3 to have charges of the first polarity, and the charged evaporation material particles 4 are evaporated onto the substrate 2 under control of repulsive force between same kind of charges on the conductive baffle 6 and the evaporation material particles 4, thereby forming a pattern of one film.

In the above evaporation device, the conductive baffle divides the evaporation chamber into several evaporation sub-chambers each provided with one evaporation sub-chamber 100, the conductive baffle 6 and the evaporation material particles have same kind of charges, thereby reducing a vapor deposition angle of the evaporation material particles under control of repulsive force between same kind of charges on the conductive baffle and the evaporation material particles, then avoiding crosstalk of the evaporation material particles evaporated from different evaporation sources and then improving evaporation quality. Meanwhile, more evaporation material particles can be evaporated onto the substrate, thereby improving utilization ratio of materials.

Furthermore, since the evaporation device of the present disclosure can avoid crosstalk of the evaporation material particles evaporated from different evaporation sources, a distance between different evaporation sources can be shortened, then the volume of the evaporation device can be reduced and the time-consuming of the evaporation process can also be reduced, thereby improving production efficiency and reducing the costs. Further, the vapor deposition angle of the evaporation material particles can be reduced through the repulsive force between same kind of charges on the conductive baffle and the evaporation material particles, which does not affect properties of materials, especially semiconductor materials on the substrates, thereby ensuring the performance of the prepared substrate.

Specifically, the particle charging circuit 5 may be an ion source. The ion source may be selected from a variety of kinds, such as a high-frequency ion source and an arc discharge ion source.

Of course, the particle charging circuit 5 may adopt other ways to enable the evaporation material particles 4 in non-molecular state to have charges.

The evaporation device of the present disclosure is suitable for vapor-depositing corresponding organic luminescent material particles in sub-pixel regions of different colors of the OLED display substrate, thereby forming a light-emitting layer capable of emitting lights of corresponding colors. Each evaporation source is used to generate luminescent material particles capable of emitting light of a specific color. The technical solution of the present disclosure can avoid crosstalk of the luminescent materials generated from different evaporation sources, and then ensures the uniformity and quality of each light-emitting layer of a large-size OLED display substrate, thereby solving the problems that some area of an OLED display panel does not emit light, reducing the number of dark spots of the panel and improving service life of the product and stability of a color coordinates.

Of course, when the evaporation device of the present disclosure is used to fabricate an OLED display substrate, the evaporation device may further include an evaporation source for generating particles of other organic material (i.e., a planarization layer).

It should be noted that the evaporation device of the present disclosure may also be used to fabricate other substrates, thereby realizing evaporation of different evaporation materials onto the substrate and then forming patterns of different films on the substrate 2, which will not be listed here.

In one embodiment, the evaporation device may further include a field generation circuit configured to generate a guiding electric field. The guiding electric field is used to drive the charged evaporation material particles 4 to be evaporated onto the substrate 2, thereby enabling more evaporation material particles to be evaporated onto the substrate 2, further improving utilization ratio of materials. Meanwhile, crosstalk of the evaporation material particles 4 evaporated from different evaporation sources 3 can be avoided.

When the evaporation device includes the field generation circuit, the field generation circuit includes a substrate charging circuit configured to control the to-be-evaporated substrate 2 to have charges of a second polarity, thereby forming the guiding electric field between the conductive baffle 6 and the substrate 2. The above technical solution can generate the guiding electric field between the conductive baffle and the substrate by enabling the conductive baffle to have charges of the first polarity and controlling the to-be-evaporated substrate to have charges of the second polarity, and the guiding electric field can drive the evaporation material particles having charges of the first polarity to be evaporated onto the substrate, which is easy to be implemented with no need to add new structures, simplifies the structure of the evaporation device and reduces the costs.

The charges of the first polarity may be positive charges (or negative charges), then the charges of the second polarity may be negative charges (or positive charges).

Specifically, the substrate 2 and the conductive baffle 6 are coupled with two ends of a power supply, respectively, thereby enabling the substrate 2 and the conductive baffle 6 to have different kinds of charges. In one embodiment, the substrate charging circuit may be an electrode of the power supply, such as a negative electrode 70 (as shown in FIG. 4) of the power supply. The charge supply circuit may be an electrode having a polarity opposite to that of the substrate charging circuit, such as a positive electrode 73 (as shown in FIG. 4) of the power supply.

It is obvious that the guiding electric field may be formed by two separate electrodes.

In order to enable the evaporation material particles 4 generated by all the evaporation sources 3 to be evaporated onto the substrate 2 in turns, a transmission device is disposed in the evaporation chamber 1. The transmission device is used to sequentially transfer the substrate 2 to each evaporation sub-chamber 100, thereby enabling the evaporation material particles 4 generated by all the evaporation sources 3 to be evaporated onto the substrate 2 in turns.

A path, along which the transmission device transfers the substrate, is related to an arrangement mode of the evaporation sub-chambers.

In an exemplary embodiment, the evaporation sources 3 are arranged along a first direction (indicated with an arrow A1 shown in FIG. 1), adjacent two evaporation sources 3 are spaced from each other by a predetermined distance, and the conductive baffles 6 divide the evaporation chamber 1 into several evaporation sub-chambers 100 along the first direction.

Accordingly, the transmission device transfers the to-be-evaporated substrate 2 along the first direction.

The above technical solution uses the conductive baffles 6 to divide the evaporation chamber into several evaporation sub-chambers along the first direction, and the structure is simple.

Since the vapor deposition angle of the evaporation material particles can be reduced through the repulsive force between same kind of charges on the conductive baffle and the evaporation material particles, and crosstalk of the evaporation material particles evaporated from different evaporation sources can be avoided, then, the distance between different evaporation sources can be shortened. Thus, the presence of several evaporation sources arranged along the first direction will not cause a length of the evaporation device to be large, and can reduce loss of the transmission device and extends the service life of the transmission device.

Specifically, the transmission device includes a rail 7 that extends along the first direction. The substrate 2 is slidably mounted on the rail 7.

The evaporation sources 3 may be arranged at equal intervals, which is not limited thereto.

In one embodiment, the evaporation device may further include a field generation circuit configured to generate a guiding electric field. The guiding electric field is used to drive the evaporation material particles 4 having charges of the first polarity to be evaporated onto the substrate, thereby enabling more evaporation material particles to be evaporated onto the substrate, further improving utilization ratio of materials.

Specifically, the field generation circuit includes a substrate charging circuit configured to control the to-be-evaporated substrate 2 to have charges of a second polarity, thereby forming the guiding electric field between the conductive baffle 6 and the substrate 2. Since the guiding electric field may be generated between the conductive baffle and the substrate by merely controlling the to-be-evaporated substrate 2 to have charges of the second polarity, and the guiding electric field can drive the evaporation material particles 4 having charges of the first polarity to be evaporated onto the substrate 2, which is easy to be implemented with no need to add new structures, simplifies the structure of the evaporation device and reduces the costs.

Further, the substrate charging circuit is also used to control a carrying structure to have charges of the second polarity, and the substrate 2 may be slidably mounted at the rail 7 through the carrying structure. In one embodiment, the carrying structure may be a sliding block 71 (as shown in FIG. 4) slidably mounted at the rail 7. The substrate 2 may be mounted on the sliding block and slides along with the sliding block relative to the rail 7 along the first direction A1.

When the evaporation device of the present disclosure is used to fabricate an OLED display substrate, the design that the to-be-evaporated substrate 2 and the carrying structure for carrying the substrate 2 have charges of the second polarity, can reduce dark points in addition to formation of the guiding electric field and driving the evaporation material particles having charges of the first polarity. Specific principles are as described above.

If conductive particles are generated in the evaporation process, the conductive particles may cause the cathode of the OLED to be electrically coupled with the anode of the OLED, thereby forming dark points. The conductive particles may be generated due to friction between the carrying structure and the rail during the process of transferring the to-be-evaporated substrate.

When the to-be-evaporated substrate 2 and the carrying structure for carrying the substrate 2 have charges of the same polarity, the conductive particles generated due to friction have charges of the same polarity as the substrate, repulsive force between same kind of charges makes it difficult for the conductive particles to fall on the substrate. The conductive particles may be attracted by the conductive baffle which has charges of a polarity which is different from the polarity of charges of the conductive particles, and then deposited on the conductive baffle, thereby avoiding the problems of dark points caused by the conductive particles generated due to friction.

Since static electricity may be generated when the carrying structure rubs against the rail 7, the rail 7 will be charged. The charged rail 7 may affect the evaporation device in some extent. Thus, it is needed to insulate the rail 7. Specifically, a layer of insulation material such as insulating ceramic may be provided at the rail 7.

In one embodiment of the present disclosure, the working process of the evaporation device is as follows.

The to-be-evaporated substrate 2 and a mask plate (not shown) are slidably mounted on the rail 7. The mask plate is at one side of the substrate 2 adjacent the evaporation source 3, so that by taking the mask plate as a barrier, the evaporation material particles 4 generated by the evaporation source 3 are deposited on a certain region of the substrate 2. Several evaporation sources 3 are arranged along the first direction, and the conductive baffle 6 disposed between adjacent two evaporation sources 3 divides the evaporation chamber 1 into several evaporation sub-chambers 100 along the first direction.

The substrate 2 is coupled with a negative electrode of a power supply, and the conductive baffle 6 is coupled with a positive electrode of the power supply.

The substrate 2 is transferred along the first direction, thereby enabling the substrate to be sequentially transferred to each evaporation sub-chamber 100.

When the substrate 2 is transferred to one evaporation sub-chamber 100, the ion source 5 is turned on, and then the evaporation source 3 is controlled to generate the evaporation material particles 4, and the ion source 5 controls the evaporation material particles 4 to have positive charges. The evaporation material particles 4 having positive charges are evaporated on the substrate 2 under action of the repulsive force between same kind of charges on the conductive baffle and the evaporation material particles as well as the guiding electric field between the conductive baffle 6 and the substrate 2, thereby completing manufacture of a required film pattern. Then, the substrate 2 is transferred to a next evaporation sub-chamber 100, and the above steps are repeated to complete manufacture of another required film pattern, until the evaporation material particles 4 generated by all the evaporation sources 3 are evaporated onto corresponding regions of the substrate 2 to complete manufacture of all required film patterns.

One embodiment of the present disclosure further provides an evaporation method implemented with the above evaporation device, and the evaporation method is used to form several patterns of films on a to-be-evaporated substrate through evaporation. Referring to FIG. 1 to FIG. 3, the evaporation method includes:

controlling the conductive baffle 6 to have charges of a first polarity, where the conductive baffle 6 is disposed between adjacent two evaporation sources 3 and divides the evaporation chamber 1 into several evaporation sub-chambers, and the evaporation sources 3 are disposed in the evaporation sub-chambers 100 in a one-to-one manner;

controlling the evaporation source 3 to generate evaporation material particles 4; and controlling the evaporation material particles 4 to have charges of the first polarity, and evaporating the charged evaporation material particles 4 onto the substrate 2 under action of repulsive force between same kind of charges on the conductive baffle 6 and the evaporation material particles 4, thereby forming a pattern of one film.

In the above evaporation method, the conductive baffle and the evaporation material particles are controlled to have same kind of charges, the conductive baffle is disposed between adjacent two evaporation sources and divides the evaporation chamber into several evaporation sub-chambers, a vapor deposition angle of the evaporation material particles can be reduced under control of repulsive force between same kind of charges, thereby avoiding crosstalk of the evaporation material particles evaporated from different evaporation sources and then improving evaporation quality. Meanwhile, more evaporation material particles can be evaporated onto the substrate, thereby improving utilization ratio of materials.

Furthermore, since the evaporation method of the present disclosure can avoid crosstalk of the evaporation material particles evaporated from different evaporation sources, a distance between different evaporation sources can be shortened, then the volume of the evaporation device can be reduced and the time-consuming of the evaporation process can also be reduced, thereby improving production efficiency and reducing the costs. Further, the vapor deposition angle of the evaporation material particles can be reduced through the repulsive force between same kind of charges on the conductive baffle and the evaporation material particles, which does not affect properties of materials, especially semiconductor materials on the substrates.

The evaporation method of the present disclosure is suitable for vapor-depositing corresponding organic luminescent material particles in sub-pixel regions of different colors of the OLED display substrate, thereby forming a light-emitting layer capable of emitting lights of corresponding colors. Each evaporation source is used to generate luminescent material particles capable of emitting light of a specific color. Then the evaporation method specifically includes: controlling the evaporation source to generate luminescent material particles capable of emitting light of a specific color; and, evaporating luminescent material particles having charges onto corresponding sub-pixel regions of the substrate under action of repulsive force between same kind of charges on the conductive baffle and the evaporation material particles, thereby forming a light-emitting layer.

When the evaporation method of the present disclosure is used to fabricate different light-emitting layers of the OLED display substrate, the evaporation method can avoid crosstalk of the luminescent materials generated from different evaporation sources, and then ensures the uniformity and quality of each light-emitting layer of a large-size OLED display substrate, thereby solving the problems that some area of an OLED display panel does not emit light, reducing the number of dark spots of the panel and improving service life of the product and stability of a color coordinates.

Of course, when the evaporation method of the present disclosure is used to fabricate an OLED display substrate, the evaporation method may further include an evaporation source for generating particles of other organic material (i.e., a planarization layer).

It should be noted that the evaporation method of the present disclosure may also be used to fabricate other substrates, thereby realizing evaporation of different evaporation materials onto the substrate and then forming patterns of different films on the substrate, which will not be listed here.

In one embodiment, the evaporation method may further include: generating a guiding electric field configured to drive the charged evaporation material particles 4 to be evaporated onto the substrate 2.

The above evaporation method can use the guiding electric field to enable more evaporation material particles to be evaporated onto the substrate, thereby further improving utilization ratio of materials. Meanwhile, crosstalk of the evaporation material particles evaporated from different evaporation sources can be avoided.

Further, the step of generating a guiding electric field may include: controlling the to-be-evaporated substrate 2 to have charges of a second polarity, thereby forming the guiding electric field between the conductive baffle 6 and the substrate 2.

The above steps can generate the required guiding electric field between the conductive baffle and the substrate by controlling the to-be-evaporated substrate to have charges of the second polarity, and the guiding electric field can drive the evaporation material particles having charges of the first polarity to be evaporated onto the substrate, which is easy to be implemented with no need to add new structures, simplifies the structure of the evaporation device and reduces the costs.

In order to enable the evaporation material particles generated by all the evaporation sources to be evaporated onto the substrate in turns, the evaporation method further includes: sequentially transferring the to-be-evaporated substrate to each evaporation sub-chamber, thereby enabling the evaporation material particles generated by all the evaporation sources to be evaporated onto the substrate in turns.

A path, along which the substrate is transferred, is related to an arrangement mode of the evaporation sub-chambers.

In an exemplary embodiment, the evaporation method may further include: transferring the to-be-evaporated substrate along the first direction, thereby enabling the charged evaporation material particles output from the evaporation source in each evaporation sub-chamber to be evaporated onto the substrate.

Structures corresponding to the above evaporation method are that several evaporation sources are arranged along the first direction, the conductive baffles divide the evaporation chamber into several evaporation sub-chambers along the first direction. Transmission of the to-be-evaporated substrate along the first direction is easy to realize in structure and has the advantages of simple structure. For example, a transmission device includes a rail that extends along the first direction, and the to-be-evaporated substrate is slidably mounted on the rail.

Further, since the vapor deposition angle of the evaporation material particles can be reduced through the repulsive force between same kind of charges on the conductive baffle and the evaporation material particles, crosstalk of the evaporation material particles evaporated from different evaporation sources can be avoided. Then, the distance between different evaporation sources can be shortened. Thus, the presence of several evaporation sources arranged along the first direction will not cause a length of the evaporation device to be large, and can reduce loss of the transmission device and extends the service life of the transmission device.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. An evaporation device for evaporating patterns of films on a to-be-evaporated substrate, the evaporation device comprising:

an evaporation chamber;
a plurality of spaced conductive baffles disposed in the evaporation chamber and dividing the evaporation chamber into a plurality of evaporation sub-chambers, wherein the conductive baffles are configured to carry charges of a first polarity;
an evaporation source disposed in at least one of the evaporation sub-chambers;
a particle charging circuit disposed in at least one of the evaporation sub-chambers;
wherein the particle charging circuit is configured to control evaporation material particles generated from the evaporation source in at least one of the evaporation sub-chambers to have charges of the first polarity; and
a transmission device disposed in the evaporation chamber, wherein the transmission device is configured to transfer the to-be-evaporated substrate along a first direction, and comprises a rail that extends along the first direction, a carrying structure for carrying the to-be-evaporated substrate is disposed at the rail, the to-be-evaporated substrate and the carrying structure have charges of a second polarity, the first polarity is opposite to the second polarity, the to-be-evaporated substrate and the carrying structure only have charges of one polarity, and a layer of insulation material is provided at the rail.

2. The evaporation device of claim 1, further comprising a field generation circuit configured to generate a guiding electric field; wherein the guiding electric field is configured to drive the charged evaporation material particles to be evaporated onto the substrate.

3. The evaporation device of claim 2, wherein the field generation circuit comprises a substrate charging circuit configured to control the to-be-evaporated substrate to have charges of a second polarity, and the guiding electric field is generated between the conductive baffles and the substrate.

4. The evaporation device of claim 3, further comprising a charge supply circuit configured to control the conductive baffles to have charges of the first polarity; wherein the substrate charging circuit and the charge supply circuit are two electrodes of opposite polarities.

5. The evaporation device of claim 1, wherein the particle charging circuit is an ion source.

6. The evaporation device of claim 1, further comprising a charge supply circuit configured to control the conductive baffles to have charges of the first polarity.

7. The evaporation device of claim 1, wherein the conductive baffles divide the evaporation chamber into several evaporation sub-chambers along the first direction.

8. The evaporation device of claim 7, wherein the to-be-evaporated substrate is slidably mounted on the rail.

9. The evaporation device of claim 7, wherein there are several evaporation sources arranged at equal intervals.

10. The evaporation device of claim 1, wherein each evaporation source is configured to generate luminescent material particles capable of emitting light of a specific color.

11. An evaporation method implemented with the evaporation device of claim 1, for evaporating patterns of films on a to-be-evaporated substrate, the evaporation method comprising:

controlling the conductive baffle in one of the evaporation sub-chambers to have charges of a first polarity;
controlling the evaporation source in one of the evaporation sub-chambers to generate evaporation material particles; and controlling the evaporation material particles generated by the evaporation source in one of the evaporation sub-chambers to have charges of the first polarity, and evaporating the charged evaporation material particles onto the substrate under action of repulsive force between same kind of charges on the conductive baffle in one of the evaporation sub-chambers and the evaporation material particles, thereby forming a pattern of one film.

12. The evaporation method of claim 11, further comprising: generating a guiding electric field configured to drive the charged evaporation material particles to be evaporated onto the substrate.

13. The evaporation method of claim 12, wherein the generating a guiding electric field comprises: controlling the to-be-evaporated substrate to have charges of a second polarity, thereby forming the guiding electric field between the conductive baffle in one of the evaporation sub-chambers and the substrate.

14. The evaporation method of claim 11, further comprising: transferring the to-be-evaporated substrate along the first direction, thereby enabling the charged evaporation material particles output by the evaporation source in each evaporation sub-chamber to be evaporated onto the substrate.

15. The evaporation method of claim 11, wherein the substrate is an organic electroluminescent display substrate; the controlling the evaporation source in one of the evaporation sub-chambers to generate evaporation material particles comprises: controlling the evaporation source in one of the evaporation sub-chambers to generate luminescent material particles capable of emitting light of a specific color;

the controlling the evaporation material particles generated by the evaporation source in one of the evaporation sub-chambers to have charges of the first polarity, and evaporating the charged evaporation material particles onto the substrate under action of repulsive force between same kind of charges on the conductive baffle in one of the evaporation sub-chambers and the evaporation material particles, thereby forming a pattern of one film, comprises:

controlling the luminescent material particles generated by the evaporation source in one of the evaporation sub-chambers to have charges of the first polarity, and evaporating the charged luminescent material particles onto a corresponding sub-pixel region of the substrate under action of repulsive force between same kind of charges on the conductive baffle in one of the evaporation sub-chambers and the evaporation material particles, thereby forming a light-emitting layer.

* * * * *